(12) United States Patent
Kohno

(10) Patent No.: US 6,898,100 B2
(45) Date of Patent: May 24, 2005

(54) SEMICONDUCTOR MEMORY DEVICE USED FOR CACHE MEMORY

(75) Inventor: Fumihiro Kohno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/736,849

(22) Filed: Dec. 17, 2003

(65) Prior Publication Data

US 2005/0083719 A1 Apr. 21, 2005

(30) Foreign Application Priority Data

Oct. 20, 2003 (JP) ........................................ 2003-359373

(51) Int. Cl.[7] .............................................. G11C 15/00
(52) U.S. Cl. .................... 365/49; 365/189.07; 711/104; 711/108; 714/5
(58) Field of Search ............................ 365/49, 189.07; 711/104, 108; 714/5

(56) References Cited

U.S. PATENT DOCUMENTS 5,596,521 A * 1/1997 Tanaka et al. ................. 365/49
5,752,260 A 5/1998 Liu
6,137,707 A 10/2000 Srinivasan et al.
6,522,563 B2 * 2/2003 Tanaka et al. ................. 365/49

* cited by examiner

Primary Examiner—Richard Elms
Assistant Examiner—N. Nguyen
(74) Attorney, Agent, or Firm—Oblon, Spivak, McClelland, Maier & Neustadt, P.C.

(57) ABSTRACT

A data memory circuit having divided several cache lines storing data, and several entries, and a tag circuit, are provided. The tag circuit having an array of an associative memory including a memory cell circuit having several memory cells storing address corresponding to the data stored in the data memory circuit and divided several rows, and a comparator circuit comparing the address stored in the memory cell circuit with input address, the comparator circuit comparing the address stored in divided several rows of the memory cell circuit with the input address concurrently in each of divided rows storing the address, and generating a cache hit/miss determination signal based on the comparative result of each row, the hit/miss determination signal being supplied to the data memory circuit.

20 Claims, 5 Drawing Sheets

SEMICONDUCTOR MEMORY DEVICE USED FOR CACHE MEMORY

CROSS-REFERENCE TO RELATED APPLICATIONS

This application is based upon and claims the benefit of priority from the prior Japanese Patent Application No. 2003-359373, filed Oct. 20, 2003, the entire contents of which are incorporated herein by reference.

BACKGROUND OF THE INVENTION

1. Field of the Invention

The present invention relates to a semiconductor memory device used for cache memory. The semiconductor memory device of the present invention is used as a multi-bit length cache memory built in a system LSI for broadband communication, for example.

2. Description of the Related Art

Recently, with high speed and high function of system LSI, data exchange must be made between main memory and central processing unit (CPU) at high speed. Thus, a cache memory interposed between both elements described above is very important. In particular, a large amount of data must be processed in the system LSI at high speed in order to meet the needs of the broadband time. For this reason, a multi-bit length cache memory is required.

In general, Dynamic Random Access Memory (DRAM) is used as the external main memory in the system LSI mounted with CPU. The DRAM has a large memory capacity, but long access time is taken to make data exchange. On the contrary, the cache memory comprises Static Random Access Memory (SRAM). The SRAM has a small memory capacity, but it can make data access at high speed.

In order to achieve the high-speed operation of the system LSI having a built-in CPU, the number of access times to the DRAM spending much time taken to access need to be reduced. For this reason, a large amount of data such as 256 bytes or 512 bytes is previously stored in the cache memory. The bit length of a data bus interposed between cache memory and CPU is, for example, 32 bits or 64 bits, although depending on the system. The data size transferred at one time between main memory and cache memory is several times as much as the same between cache memory and CPU.

In general, the cache memory is composed of a data memory circuit including a SRAM cell, and a tag circuit including a Content Addressable Memory (hereinafter, referred to as CAM). More specifically, the SRAM cell temporarily stores cache data, which is data copy of part of the main memory. The CAM stores address corresponding to data stored in the data memory circuit, that is, part of address supplied from a fetch counter provided in the CPU.

If necessary data is stored in the cache memory, that is, if the data hits on the cache memory, the input address is compared with the address held in the tag circuit. Thereafter, data of the data memory circuit corresponding to the matched entry is read. Basically, the tag circuit and the data memory circuit make one-to-one correspondence, and with the development of broadband, the data size handled by the cache memory is becoming larger.

In view of the circumstances described above, the following cache memory has been proposed in order to soften the limitation of bus width in the system LSI, and to reduce the LSI chip area. In the cache memory, the row direction length of the data memory circuit, that is, bit length is divided into several parts so that data can be stored in several rows. Write data is written to these several rows at divided several cycles.

FIG. 1 shows a conventional example of the cell array pattern layout in a cache memory, which is configured in a manner that one unit data is stored in divided two rows by a data memory circuit. The cache memory includes a data memory circuit 10 and a tag circuit 80.

The data memory circuit 10 stores data input from the main memory. The tag circuit 80 is provided with several CAM cells having a function of comparing address. The tag circuit 80 has a function of storing write address of the main memory corresponding to data stored in the data memory circuit 10 and compare address input from a CPU, and making comparison between both addresses.

When one unit data is stored divided two rows by the data memory circuit 10, data write to the data memory circuit 10 requires two entries. It is determined by index address which of two entries should be selected. On the contrary, the write of write address to the tag circuit 80 requires only one entry.

In the conventional cache memory, the array configuration of the tag circuit 80 is determined depending on the bit length of write data. When a large amount of data for broadband communication is handled, the data size becomes very large. For this reason, the physical length of the word line direction of the tag circuit 80 becomes extremely long. This is a factor of hindering high-speed operation.

The configuration of memory cell differs from the tag circuit 80 and the data memory circuit 10. The data memory circuit 10 requires the number of many entries. For this reason, clearances 90 generated in the cell array of the tag circuit 80 increase as seen from FIG. 1; as a result, wasteful areas are generated. Thus, the area of an LSI chip integrated with the foregoing cache memory also increases.

In addition, with high speed and high function of the cache memory, the configuration of the memory cell becomes complicate in the data memory circuit 10. If the pursuit of the optimal aspect ratio is made, the physical layout height of the cache memory increases. In this case, the data memory circuit 10 is higher than the tag circuit 80 in the physical layout height. For this reason, clearance is generated in the pattern layout of the cache memory; as a result, wasteful area is generated in the LSI chip area.

U.S. patent Ser. No. 5,752,260 discloses the cache memory in which two-series CAM cells are provided, and the CAM cell compares three addresses, that is, two virtual addresses and one real address. In this case, a plurality of CAM cells is divided in the word line direction, and a match line is led every divided CAM cell. A selector selects one from several match lines. The output of the selector is latched, and thereafter, used as a signal for driving the CAM and the word line of the data memory circuit. Thus, the next data is set up during data read. Data equivalent to two blocks is read from a single cache line.

As seen from the foregoing description, the conventional cache memory has the following problems. That is, the data size becomes large, and thereby, the physical length of the word line direction becomes extremely long. As a result, the high-speed operation is hindered. In addition, clearance increases in the cell array of the tag circuit, and wasteful areas are generated; as a result, the LSI chip area increases. Therefore, it is desired to solve the conventional problems described above.

BRIEF SUMMARY OF THE INVENTION

According to an aspect of the present invention, there is provided a semiconductor memory device comprises:

a data memory circuit having divided several cache lines storing data, and several entries; and a tag circuit connected to the data memory circuit;

the tag circuit having an array of an associative memory including: a memory cell circuit having several memory cells storing address corresponding to the data stored in the data memory circuit and divided several rows; and a comparator circuit comparing the address stored in the memory cell circuit with input address;

the comparator circuit comparing the address stored in divided several rows of the memory cell circuit with the input address concurrently in each of divided rows storing the address, and generating a cache hit/miss determination signal based on the comparative result of each row, the hit/miss determination signal being supplied to the data memory circuit.

DETAILED DESCRIPTION OF THE INVENTION

Figure 2:
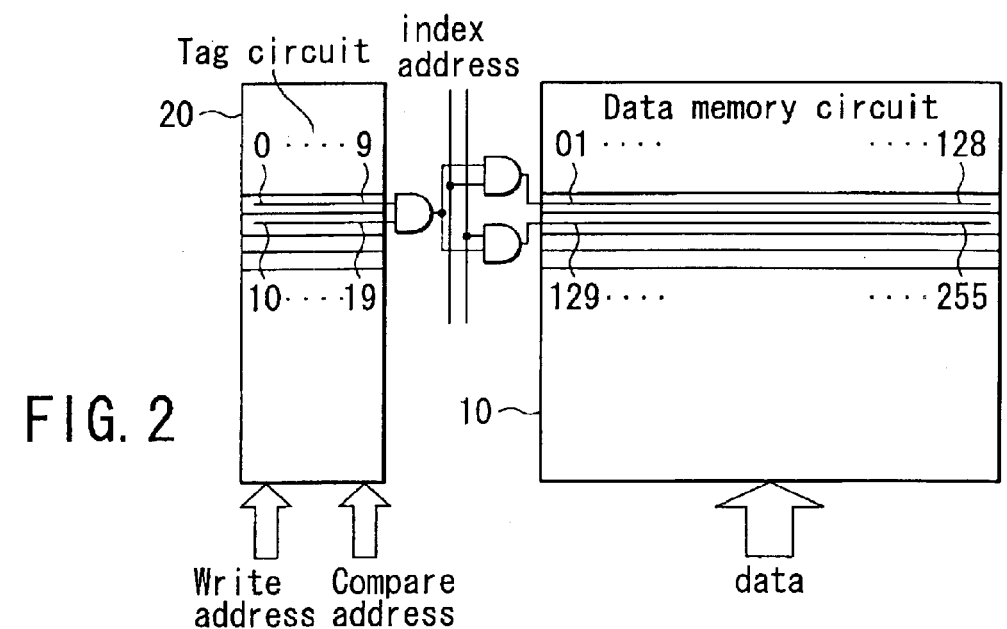
FIG. 2 is a layout diagram schematically showing the configuration of a cache memory according to a first embodiment of the present invention.

FIG. 2 schematically shows the configuration of a cache memory according to a first embodiment of the present invention. The cache memory is interposed between CPU and main memory in a system using the CPU. The cache memory includes a data memory circuit 10 and a tag circuit 20, and is integrated in an LSI chip together with the CPU.

Data, which is a copy of part of data of the main memory, is input to the data memory circuit 10. The data memory circuit 10 has a cache line, which comprises several SRAM cells temporarily storing the data. Each cache line is divided into some lines, that is, two in the embodiment. Therefore, the data memory circuit 10 has two entries.

In the embodiment, when access is made with respect to the cache line of the data memory circuit 10, either of divided two entries thereof is selected in accordance with index address. When access is made with respect to all data in the cache line, the index address is changed for each cycle, and one cache line is accessed at two cycles in total.

The tag circuit 20 includes a CAM cell array comprising several CAM cells, and CAM cells of divided two rows are provided corresponding to each cache line of the data memory circuit 10.

Figure 3:
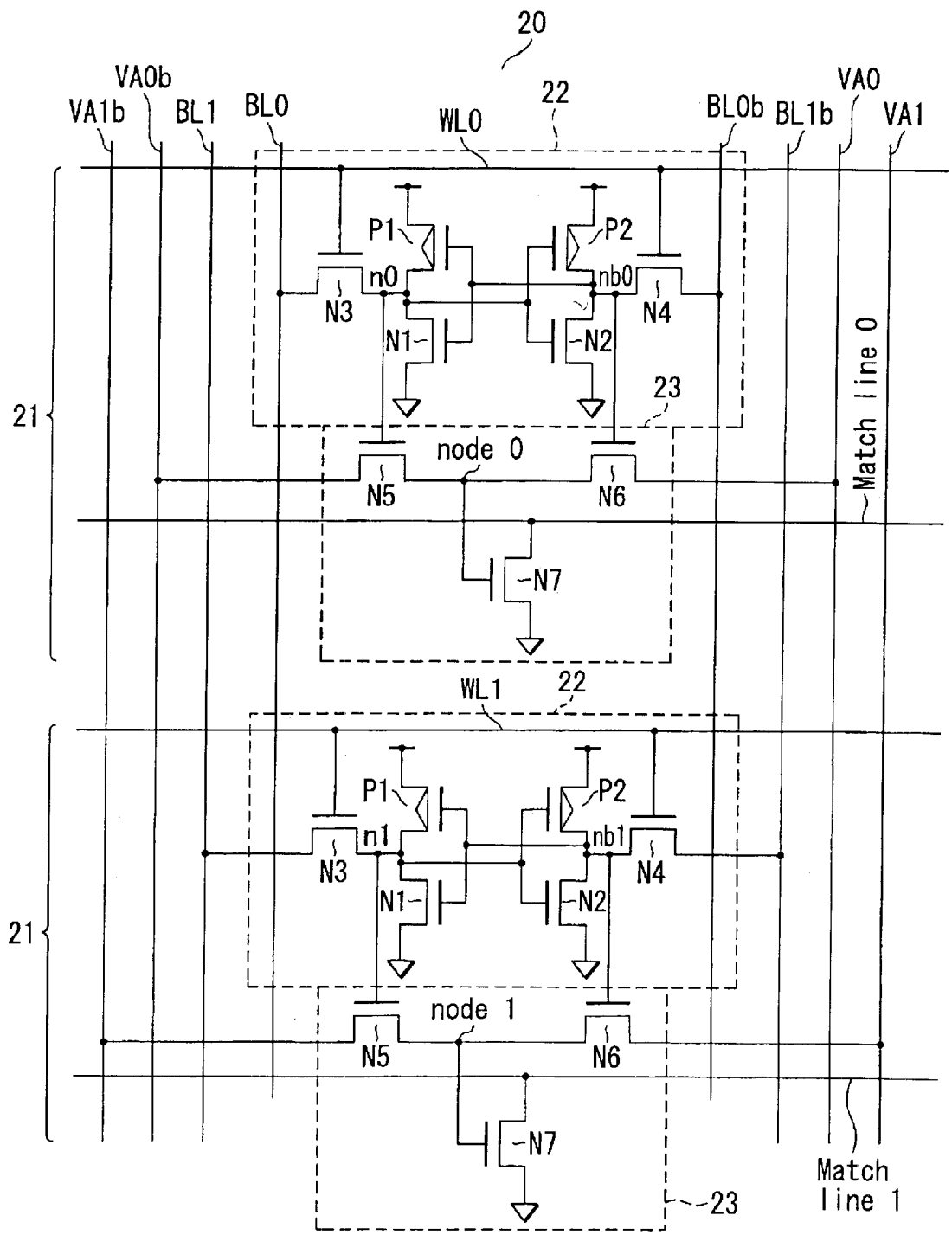
FIG. 3 is a circuit diagram showing the configuration of a cell array of a tag circuit in the cache memory shown in FIG. 2.

FIG. 3 shows the circuit configuration of part of the CAM cell array of the tag circuit 20 shown in FIG. 2, that is, CAM cells of divided two rows. As seen from FIG. 3, the tag circuit 20 has a CAM cell array which comprises several arrayed CAM cells 21 with comparison function. Each CAM cell 21 comprises an SRAM 22 and a comparator circuit 23. More specifically, the SRAM cell 22 stores write address (content address) of the main memory corresponding to data stored in the data memory circuit 10. The comparator circuit 23 compares the content address stored in the SRAM 22 with compare address input from the CPU.

The tag circuit 20 stores content address in divided two rows, like the cache line of the data memory circuit 10. In other words, the area storing one content address is divided into two rows in the embodiment. The comparator circuit 23 concurrently makes a comparison between content address and compare address of each row stored in the SRAM 22. Based on the comparative result of each row, a cache hit/miss determination signal is generated, and thereafter, supplied to the data memory circuit 10.

In the tag circuit 20, when content address is written to several CAM cells of divided two rows, the content address may be written in each row concurrently at one cycle, and may be written in each row successively at several cycles.

In FIG. 2, numerical values shown in data memory circuit 10 and tag circuit 20 express each bit position of data or address stored in the cell.

In the tag circuit 20, of several CAM cells 21 divided two rows, the CAM cells 21 of the first row are connected with a word line WL0 and a match line Match line0 in common. The CAM cells 21 of the second row are connected with a word line WL1 and a match line Match line1 in common.

Each SRAM cell 22 of the CAM cell 21 includes a pair of drive NMOS transistors N1 and N2, load PMOS transistors P1 and P2, and transfer gate NMOS transistors N3 and N4. The paired transfer gate NMOS transistors N3 and N4 are interposed between a pair of memory nodes n0, nb0 or n1, nb1 and a pair of complementary bit lines BL0, BL0*b* or BL0, BL1*b*.

Each comparator circuit 23 of the CAM cell 21 includes a pair of comparison NMOS transistors N5 and N6, and a comparison output NMOS transistor N7. In the NMOS transistors N5 and N6, their gates are connected to the paired memory nodes n0, nb0 or n1, nb1, and their source/drain have one terminals connected to each other. In the NMOS transistor N7, the gate is connected to an internal comparison node node0 or node1 mutually connected with the paired NMOS transistors N5 and N6. The source/drain is interposed between the match line Match line0 or Match line1 and a ground potential node.

In the tag circuit 20, in each CAM cell 21 of the same column of the CAM cell array, the SRAM cell 22 of the first row is connected a pair of bit lines BL0 and BL0*b*, and the SRAM cell 22 of the second row is connected a pair of bit lines BL1 and BL1*b*. The comparator circuit 23 of the CAM cell 21 of the first row is connected with a pair of complementary address bit lines VA0 and VA0*b*. The comparator circuit 23 of the CAM cell 21 of the second row is connected with a pair of complementary address bit lines VA1 and VA1*b*.

Figure 4:
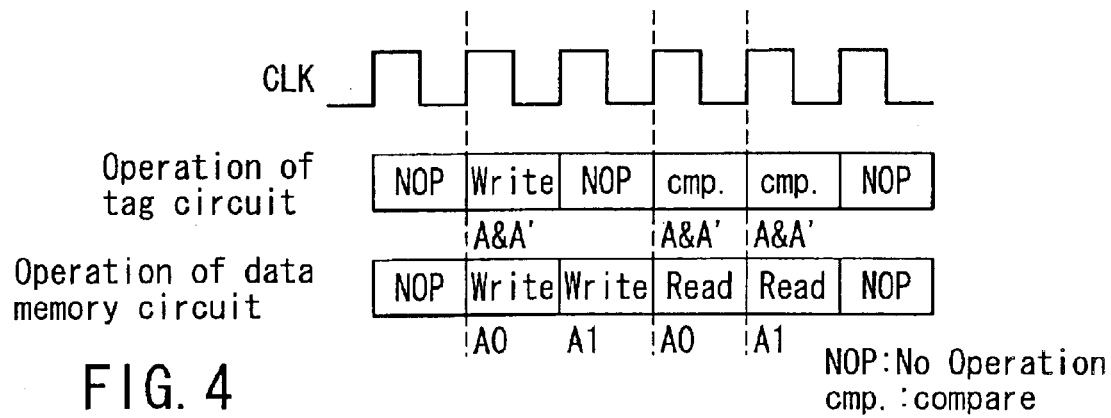
FIG. 4 is a timing chart to explain the data access operation of the cache memory shown in FIG. 2.

FIG. 4 is a timing chart to explain the data access operation of the cache memory shown in FIG. 2. The operation of the cache memory shown in FIG. 2 will be described below with reference to FIG. 4.

In the write operation, at the first cycle of a clock signal CLK, address data A&A' divided into two rows are written concurrently correspondingly to CAM cells 21 divided into two rows in the tag circuit 20. Data is written to one of the cache lines corresponding to address A0 in the data memory circuit 10. At the second cycle of the clock signal CLK, no operation is made in the tag circuit 20 (No Operation: NOP). On the other hand, data is written to one of the cache lines corresponding to address A1 in the data memory circuit 10.

In the next compare/read operation, at both first and second cycles, the tag circuit 20 compares address data A&A' of two rows stored in the CAM cell 22 with compare address supplied to address bit lines VA0, VA0b and VA1, VA1b (compare: cmp). When data hits on cache, the data memory circuit 10 reads data from two cache lines corresponding to addresses A0 and A1.

Figure 5:
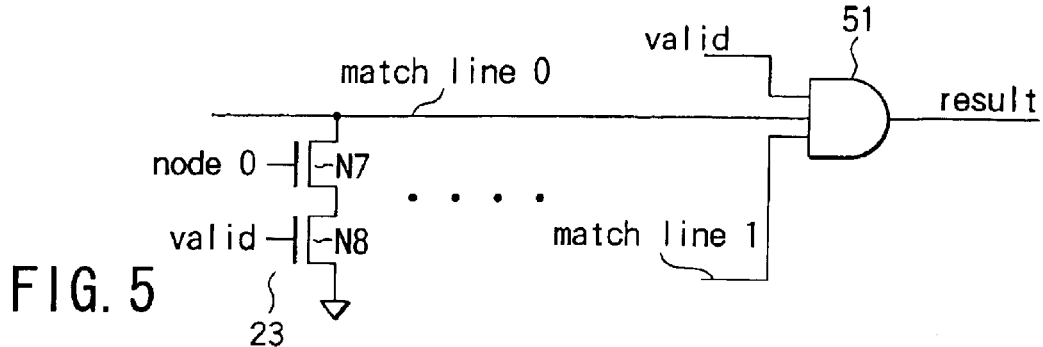
FIG. 5 is a circuit diagram showing the configuration of a determination circuit included in the tag circuit shown in FIG. 3.

FIG. 5 shows the configuration of a hit/miss determination circuit included in the tag circuit 20 shown in FIG. 2. The hit/miss determination circuit determines whether or not the cache memory hits, based on the comparative result of each row output to two match lines Match line0 and Match line1 shown in FIG. 3, and thereafter, outputs the result. The hit/miss determination circuit may be composed of an AND gate circuit 51 shown in FIG. 5. The AND gate circuit 51 is supplied with an enable/disable control signal "valid", together with the comparative result of each row output to two match lines Match line0 and Match line1. As seen from FIG. 5, an NMOS transistor N8 having a gate input with the control signal "valid" may be interposed between the NMOS transistor N7 of each comparator circuit 23 and a ground potential node.

Each comparator circuit 23 compares bit values of address input from the CPU, that is, compare address, and address stored in each SRAM cell 22, that is, content address. The match line corresponding to coincidence bit is held at "H" level; on the other hand, the match line corresponding to non-coincidence bit is set to "L" level. If the comparative result of all comparator circuits 23 connected to the same match line is all "H" level, compare address and content address fully coincide with each other, that is, it is detected as cache hit. Thus, data of the data memory circuit 10 of the entry corresponding to the match line is read. On the contrary, if the match line is "L" level, data of the entry corresponding to the match line is not read. When the signal "valid" is "H", the hit/miss determination circuit makes the determination operation. Therefore, unnecessary operation of the hit/miss determination circuit is prevented, so that consumption power can be reduced.

In data write to the data memory circuit 10, cache hit determination is not necessary; therefore, the tag circuit 20 has no need of comparing address. Thus, the control signal "valid" is set to "L" level so that the hit/miss determination circuit shown in FIG. 5 does not operate.

In the cache memory having the configuration shown in FIG. 2 to FIG. 5, the data memory circuit 10 and the tag circuit 20 are arranged in each of divided two rows. Address comparison is made concurrently in two rows, and thereby, hit/miss determination is carried out.

Figure 1:
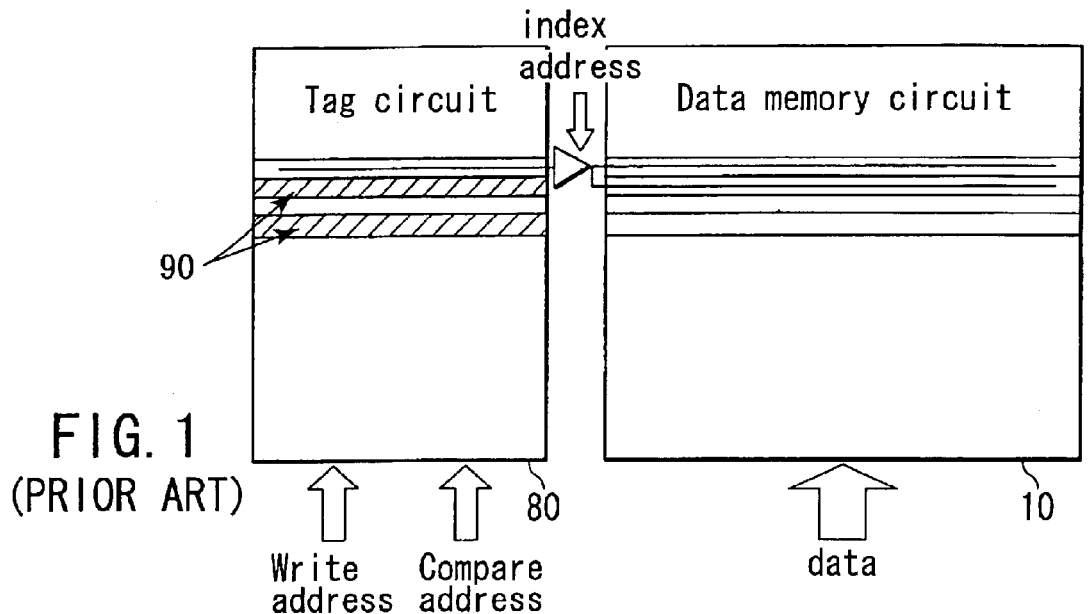
FIG. 1 is a block diagram showing a conventional example of the cell array pattern layout of a cache memory.

When handling large size data for broadband communication, wasteful areas are generated in the tag circuit. This results from the difference in the number of entries between the data memory circuit and the tag circuit included in the conventional cache memory shown in FIG. 1. However, the configuration described above is employed, and thereby, no wasteful area is generated in the cache memory of the foregoing embodiment. Therefore, the area of the tag circuit can be effectively used. In addition, the physical length of the word line direction of the tag circuit is substantially half of the conventional case. Therefore, the layout area of the cache memory is reduced, so that the chip area can be prevented from increasing.

The length of the match line to which the comparative result of content address stored in the tag circuit and input compare address is transmitted is substantially half of the conventional case. As a result, signal delay time of the match line is substantially ¼ of the conventional case, so that high-speed signal propagation (transmission) can be achieved in the match line. In addition, load to the match line is reduced; therefore, the element size is made small in the match line drive transistor, for example, NMOS transistors N7 and N8. The occupied area on the chip of the comparator circuit 23 is also made small. The same effect as explained about the match line is obtained in the word line.

The first embodiment has explained about the case where each cache line is divided into two, and the area of the tag circuit 20 storing one content address is divided into two rows corresponding to the cache line. In this case, both cache line and area may be divided into two or more.

The following is a description on a first modification example of the first embodiment. According to the first embodiment, data write to divided two cache lines (several SRAM cells) require two cycles in the data memory circuit 10. Thus, the following modification may be made. More specifically, data write to CAM cells of two rows of the tag circuit 20 corresponding to the entry may be carried out for two cycles. According to the first modification, a pair of write/read bit lines BL and BLb is used in common with respect to CAM cells 21 of two rows, as seen from FIG. 6. Therefore, the chip area can be reduced. In particular, if the size of the CAM cell 21 of the tag circuit 20 is determined by the number of interconnects (wiring), the number of interconnects is reduced, and thereby, the chip area can be greatly reduced.

Figure 7:
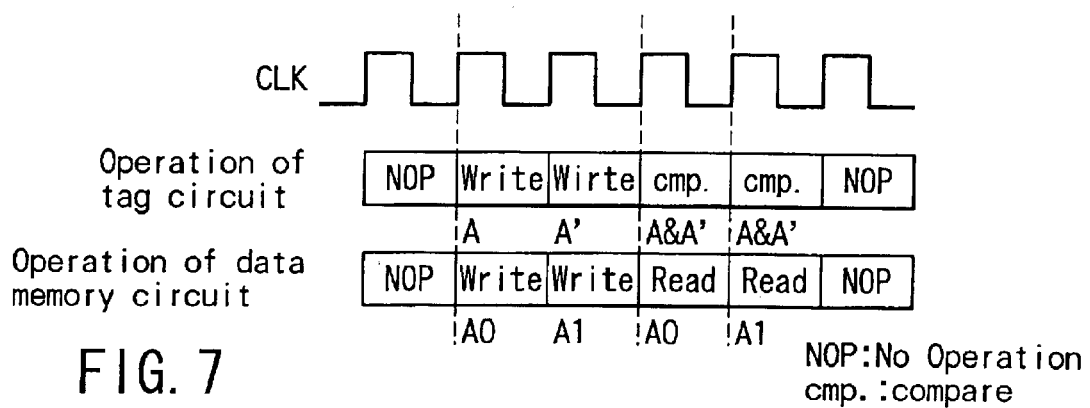
FIG. 7 is a timing chart to explain the data access operation of the cache memory shown in FIG. 6.

FIG. 7 is a timing chart to explain the data access operation with respect to the cache memory according to the first modification example.

In the write operation at the first cycle, one data A of address data A&A' of two rows is written in the tag circuit 20. On the other hand, data is written to one of the cache line of the data memory circuit 10 corresponding to the address A0. In the write operation at the second cycle, the other data A' of address data A&A' of two rows is written in the tag circuit 20. On the other hand, data is written to one of the cache line of the data memory circuit 10 corresponding to the next address A1.

In the next compare/read operation, the comparison of address data A&A' of two rows with compare address is made at both first and second cycles in the tag circuit 20 (compare: cmp.). When cache hits, data of divided two cache lines is read correspondingly to the first and second cycles in the data memory circuit 10.

In the cache memory according to the first modification example of the first embodiment, the same effect as the cache memory of the first embodiment is obtained. In addition, since data is written in the tag circuit 20 for two cycles like the data memory circuit 10, write/read common bit lines BL and BLb are used in common in the same column. Therefore, the configuration of the cell array is simplified while the chip area is reduced.

Figure 8:
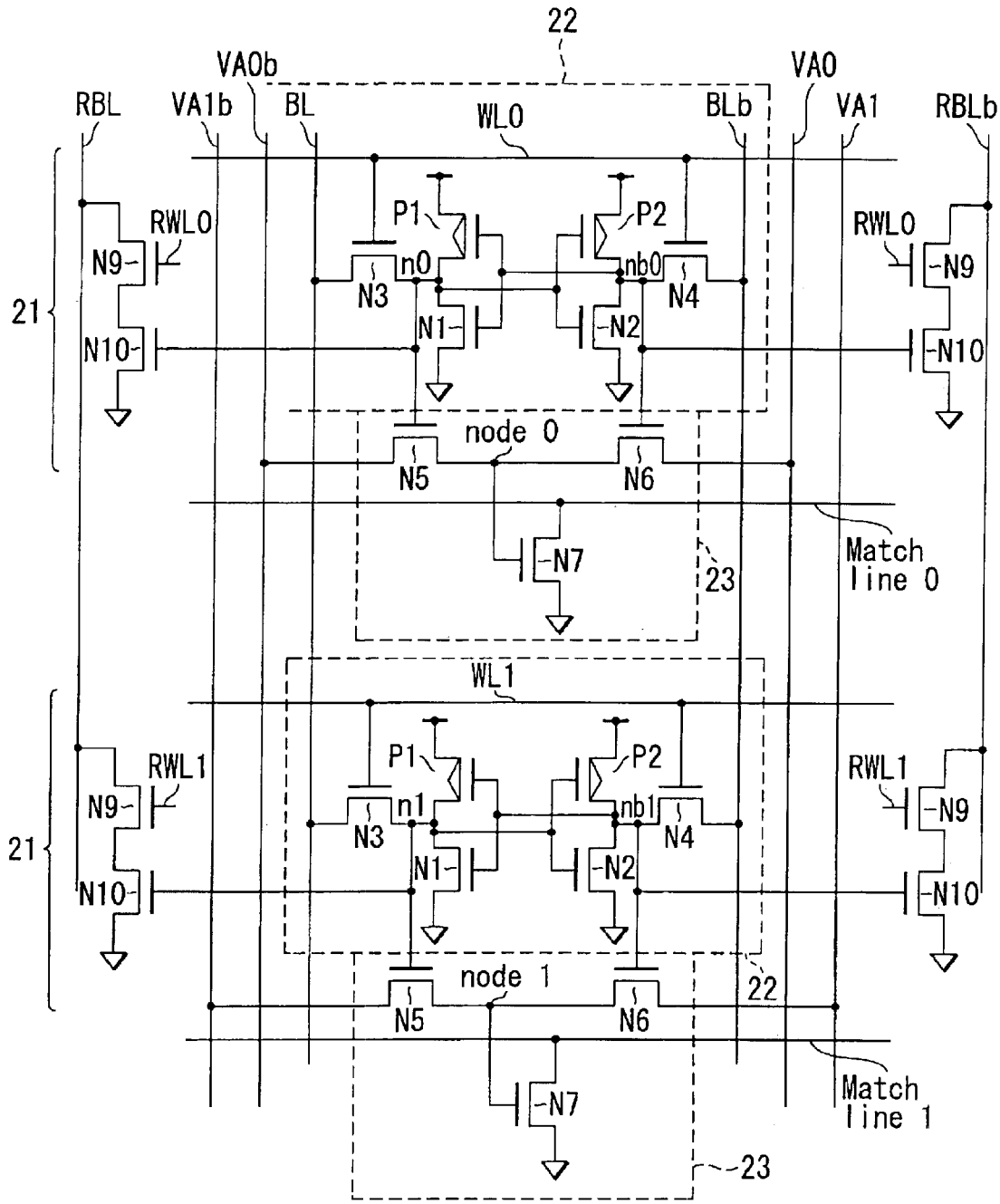
FIG. 8 is a circuit diagram showing the configuration of a cell array of a tag circuit according to a second modification example of the first embodiment.

The following is a description on a second modification example of the first embodiment. In the first embodiment, the CAM cell 21 of the tag circuit 20 is connected with the write/read common bit line. In this case, the CAM cell 21 of the tag circuit 20 may be connected with write-only bit line and read-only bit line. The second modification example will be described below with reference to FIG. 8.

Figure 6:
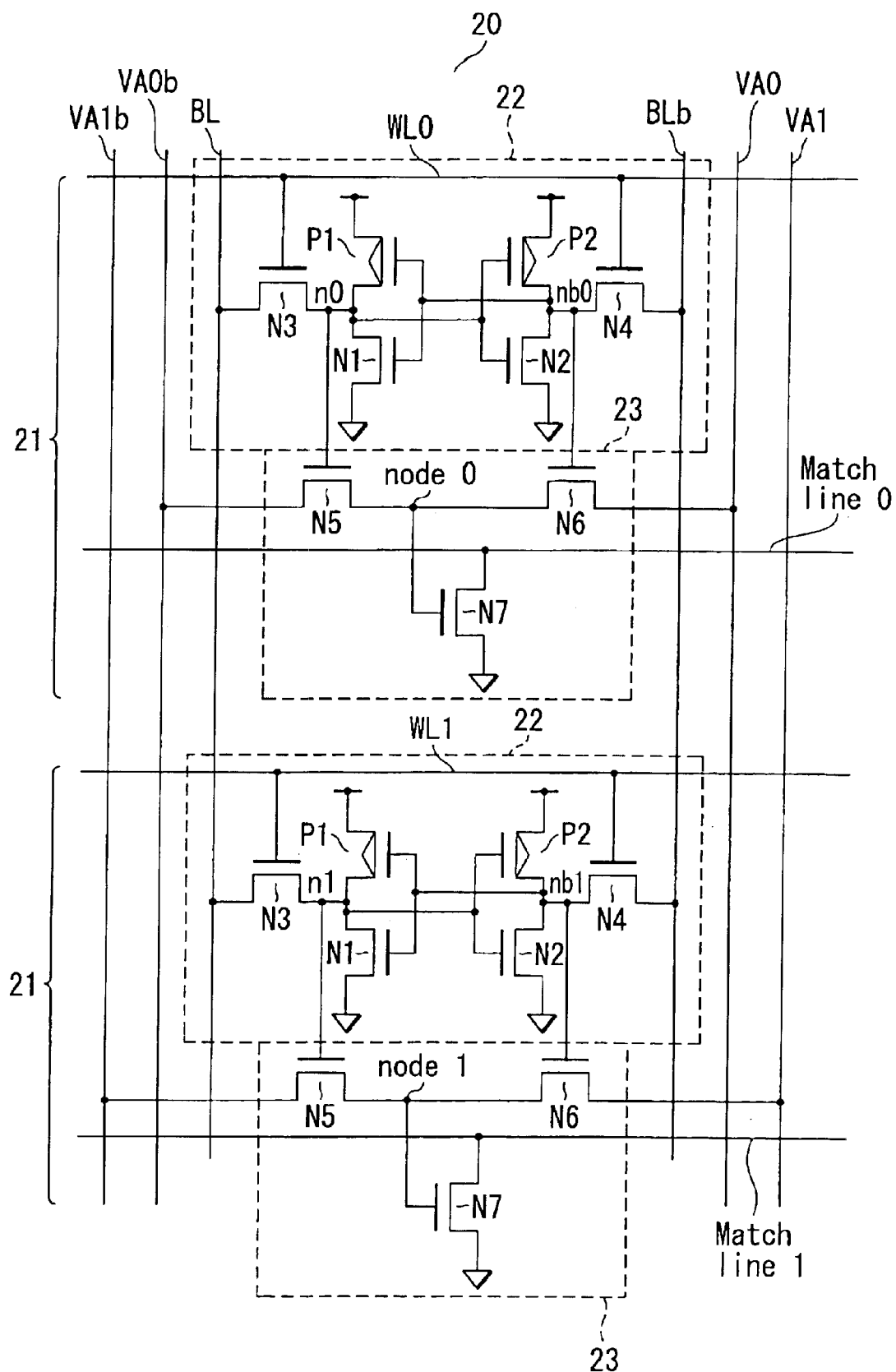
FIG. 6 is a circuit diagram showing the configuration of a cell array of a tag circuit in the cache memory according to a first modification example of the first embodiment.

The CAM cell 21 of the second modification example differs from that of the tag circuit 20 described in FIG. 6 in the following points. Other configuration is the same as FIG. 6, and the same reference numerals as FIG. 6 are given. Word lines WL0 and WL1 are used as write-only word line, and the CAM cell 21 is newly provided with read-only word lines RWL0 and RWL1. The paired bit lines BL and BLb are used as a pair of write-only bit line, and the CAM cell 21 is newly provided with a pair of read-only bit lines RBL and RBLb. In addition, series-connected NMOS transistors N9 and N10 are interposed between read-only bit lines RBL, RBLb and a ground node. More specifically, the NMOS transistor N9 has a gate connected to the paired read-only word lines RWL0 and RWL1. The NMOS transistor N10 has a gate connected to a pair of memory nodes nO and nb0 or n1 and nb1 of the SRAM cell 22.

The cache memory according to a second embodiment will be described below.

According to the first embodiment, in the data memory circuit, the physical layout height of divided each cache line is higher than that of the tag circuit 20. In this case, the tag circuit 20 is divided into the same number as the data memory circuit 10. However, the tag circuit 20 may be divided into the division number of the data memory circuit 10 or more, as the need arises.

If the pursuit of high speed and high function of the cache memory is made, the memory configuration becomes complicate. In other words, even if the data memory circuit 10 is not divided, the physical layout height, that is, the longitudinal size of the layout pattern is higher than that of the tag circuit 20. In such a case, the memory cell of the tag circuit 20 is divided, and address may be concurrently compared.

Figure 9:
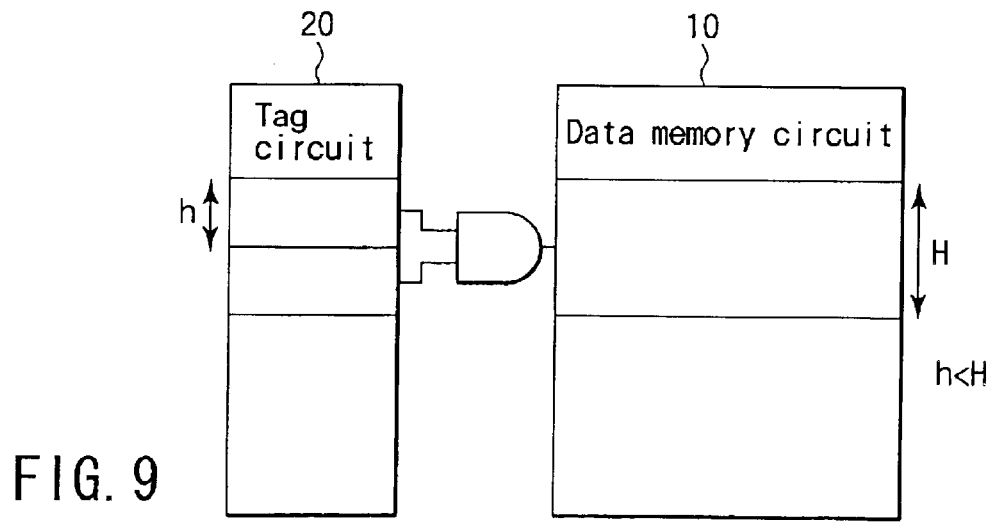
FIG. 9 is a layout diagram schematically showing the configuration of a cache memory according to a second embodiment of the present invention.

FIG. 9 shows the arrangement of a cell array of a cache memory according to a second embodiment.

The cache memory of the second embodiment differs from that of the first embodiment shown in FIG. 2 in that the cache line of the data memory circuit 10 is not divided into several lines. The tag circuit 20 is divided into several, for example, two, and the same reference numerals are used to designate the same parts as FIG. 2. In FIG. 9, "H" denotes a layout height of unit area of the data memory circuit 10, and "h" denotes a layout height of unit area of the tag circuit 20, and further, the relation of h<H is given.

According to the second embodiment, the physical layout height of the tag circuit 20 is set within the physical layout height of the data memory circuit 10, preferably, to the same height. By doing so, the number of access cycles of the tag circuit 20 is set within that of the data memory circuit 10, so that area loss can be reduced in the tag circuit 20.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a data memory circuit having divided several cache lines storing data, and several entries; and
   a tag circuit connected to the data memory circuit;
   the tag circuit having an array of an associative memory including: a memory cell circuit having several memory cells storing address corresponding to the data stored in the data memory circuit and divided several rows; and a comparator circuit comparing the address stored in the memory cell circuit with input address;
   the comparator circuit comparing the address stored in divided several rows of the memory cell circuit with the input address concurrently in each of divided rows storing the address, and generating a cache hit/miss determination signal based on the comparative result of each row, the hit/miss determination signal being supplied to the data memory circuit.

2. The device according to claim 1, wherein access to the cache line of the data memory circuit is made by selecting the corresponding entry from divided several lines in accordance with index address.

3. The device according to claim 1, wherein when the address is written to the memory cell circuit of several rows of the tag circuit, write is carried out at several cycles.

4. The device according to claim 1, wherein the same column memory cell of the memory cells of several rows of the tag circuit is connected to a common write bit line.

5. The device according to claim 1, wherein the same column memory cell of the memory cells of several rows of the tag circuit is connected to a common read bit line.

6. The device according to claim 1, wherein the same column memory cell of the memory cells of several rows of the tag circuit is connected to common write and read bit lines.

7. The device according to claim 1, wherein a compare/determine operation of the comparator circuit is controlled according to a control signal.

8. The device according to claim 1, wherein the tag circuit is controlled so that address comparison is not made during data write to the data memory circuit.

9. The device according to claim 8, wherein the comparator circuit is controlled so that the compare/determine operation is not made during data write to the data memory circuit.

10. A semiconductor memory device comprising:
    a data memory circuit having divided two cache lines storing data, and two entries; and
    a tag circuit connected to the data memory circuit;
    the tag circuit having an array of an associative memory including: a memory cell circuit having several memory cells storing address corresponding to the data stored in the data memory circuit and divided two rows; and a comparator circuit comparing the address stored in the memory cell circuit with input address;
    the comparator circuit comparing the address stored in divided two rows of the memory cell circuit with the input address concurrently in each of divided two rows storing the address, and generating a cache hit/miss determination signal based on the comparative result of each row, the hit/miss determination signal being supplied to the data memory circuit.

11. The device according to claim 10, wherein access to the cache line of the data memory circuit is made by selecting the corresponding entry from divided two lines in accordance with index address.

12. The device according to claim 10, wherein when the address is written to the memory cell circuit of two rows of the tag circuit, write is carried out at several cycles.

13. The device according to claim 10, wherein the same column memory cell of the memory cells of several rows of the tag circuit is connected to a common write bit line.

14. The device according to claim 10, wherein the same column memory cell of the memory cells of two rows of the tag circuit is connected to a common read bit line.

15. The device according to claim 10, wherein the same column memory cell of the memory cells of two rows of the tag circuit is connected to common write and read bit lines.

16. The device according to claim 10, wherein a compare/determine operation of the comparator circuit is controlled according to a control signal.

17. The device according to claim 10, wherein the tag circuit is controlled so that address comparison is not made during data write to the data memory circuit.

18. The device according to claim 17, wherein the comparator circuit is controlled so that the compare/determine operation is not made during data write to the data memory circuit.

19. A semiconductor memory device comprising:

a data memory circuit temporarily storing data; and a tag circuit connected to the data memory circuit;

the tag circuit having an array of an associative memory including: a memory cell circuit having several memory cells storing address corresponding to the data stored in the data memory circuit and divided several rows; and a comparator circuit comparing the address stored in the memory cell circuit with input address;

the comparator circuit comparing the address stored in divided several rows of the memory cell circuit with the input address concurrently in each of divided rows storing the address, and generating a cache hit/miss determination signal based on the comparative result of each row, the hit/miss determination signal being supplied to the data memory circuit.

20. The device according to claim 19, wherein the same column memory cell of the memory cells of several rows of the tag circuit is connected in common to any of write and read bit lines, write bit line and read bit line.

* * * * *